United States Patent [19]

Yamashita et al.

[11] Patent Number: 5,786,604
[45] Date of Patent: Jul. 28, 1998

[54] ELEMENT-ISOLATED HYDROGEN-TERMINATED DIAMOND SEMICONDUCTOR DEVICE AND ITS MANUFACTURING METHOD

[75] Inventors: Satoshi Yamashita, Tokyo; Hiroshi Kawarada, Kanagawa-ken; Masahiro Itoh, Tokyo; Naofumi Nakamura, Kanagawa-ken, all of Japan

[73] Assignee: Tokyo Gas Co., Ltd., Tokyo, Japan

[21] Appl. No.: 527,809

[22] Filed: Sep. 13, 1995

[30] Foreign Application Priority Data

Sep. 16, 1994 [JP] Japan .................................. 6-221276
Mar. 23, 1995 [JP] Japan .................................. 7-064035

[51] Int. Cl.$^6$ ................ H01L 31/0312; H01L 29/00; H01L 29/12
[52] U.S. Cl. ................ 257/77; 257/280; 257/499; 257/613
[58] Field of Search ............... 257/77, 280, 499, 257/613

[56] References Cited

U.S. PATENT DOCUMENTS 5,278,430  1/1994  Kakumu ................................. 257/77
5,523,588  6/1996  Nishimura et al. ................... 257/77

FOREIGN PATENT DOCUMENTS 49-45629  12/1974  Japan .
5-229896   9/1993  Japan ................................. 257/77

OTHER PUBLICATIONS

K. Kobashi et al.; Proc. 2$^{nd}$ Int. Conf., Appl. of Diamond Films and Related Materials, ed. (Saitama 1992) pp. 35–42.
Diamond Thin–Film Recessed Gate Field–Effect Transistors Fabricated by Electron Cyclotron Resonance Plasma Etching: S.A. Grot, G.S. Gildenblat, and A.R. Badzian, IEEE Electron Device Lett. vol. 13, No. 9, Sep. 1992, pp. 462–463.
Aoki, Ito, Kawarada, et al.: Brief of 40$^{th}$ Joint Meeting Related to Applied Physics, p. 30, MK11, 12.

Primary Examiner—Steven H. Loke
Attorney, Agent, or Firm—Armstrong, Westerman, Hattori, McLeland & Naughton

[57] ABSTRACT

A diamond semiconductor device having at least one MESFET integrated on a single diamond substrate and insulated from other semiconductor elements is made by preparing a homoepitaxial diamond film 1 having a hydrogen-terminated surface; then making a drain ohmic contact 3, a source ohmic contact 4, both of gold, and a gate electrode 5 of aluminum on the film 1; and changing a site of the hydrogen-terminated surface other than the site for the MESFET to be terminated with atoms other than hydrogen atoms.

5 Claims, 9 Drawing Sheets

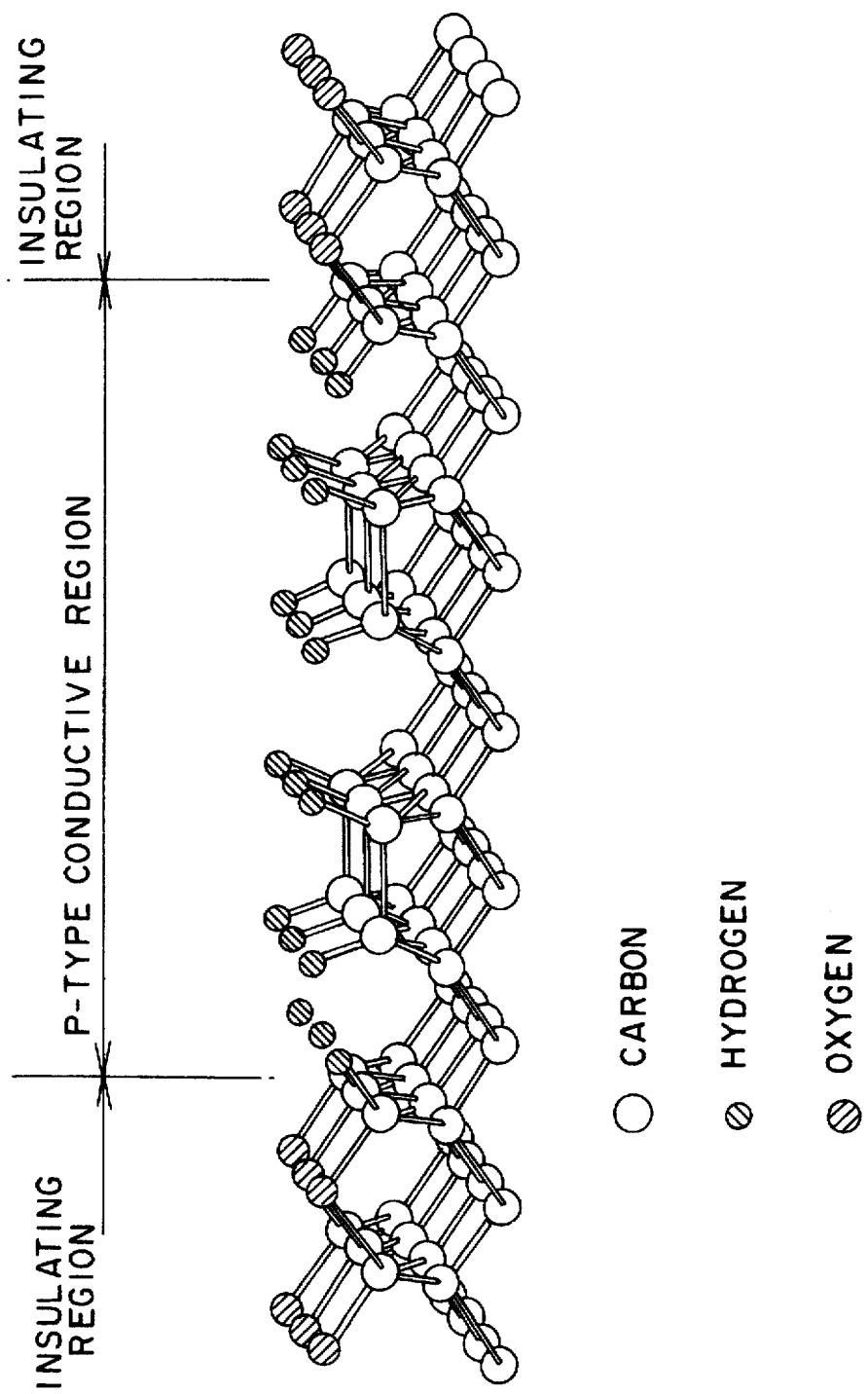

ELEMENT-ISOLATED HYDROGEN-TERMINATED DIAMOND SEMICONDUCTOR DEVICE AND ITS MANUFACTURING METHOD

BACKGROUND OF THE INVENTION

1. Field of the Invention

This invention relates to a semiconductor device using hydrogen-terminated diamond to incorporate semiconductor elements insulated from each other, and to a method for fabricating the semiconductor device.

2. Description of the Prior Art

Conventional diamond FETs are fabricated using a p-type semiconductor layer made by doping boron atoms into a diamond layer (K. Kobashi, K. Nishimura, K. Miyata, R. Nakamura, H. Koyama, K. Saito and D. L. Dreifus: Proc. 2nd Int. Conf., Appl. of Diamond Films and Related Materials., ed. M. Yoshikawa, M. Murakawa, Y. Tzeng and W. A. Yarbrough, pp 35–42 (Saitama, 1993)).

FIG. 7 is a schematic plan view of a conventional FET, and FIG. 8 is a fragmentary cross-sectional view taken along the B—B line of FIG. 7. FET 80 is made by first depositing a diamond layer 82 on a substrate 81 with no impurity doped and a boron-doped layer 83 on the diamond layer 82, then making an annular $p^{30}$ region 84, a circular region 85 concentric with the annular region 84 and an annular non-doped region 86 between the annular region 84 and the circular region 85, further making a source ohmic contact 87, a drain ohmic contact 88 or a gate electrode 89 on the respective regions. That is, this FET requires a circular geometry of elements as shown in FIG. 7 to prevent leakage of a current to the exterior, and does not suit for microminiaturization or for integration of such elements with a high density.

In regard of Si semiconductors, LOCOS technique is used as an element insulating technique for insulating and isolating elements from each other by providing an oxide layer as shown in, for example, Japanese Patent Post-examination Publication Sho 49-45629. The LOCOS technique, however, cannot be used for diamond semiconductor devices because diamond itself is not readily oxidized thick enough to form an oxide film on the surface of the diamond. An alternative approach for isolating elements on a diamond semiconductor device selectively removes semiconductor regions by etching, etc. to isolate respective elements on a diamond substrate as taught in, for example, "Diamond Thin-Film Recessed Gate Field-Effect Transistors Fabricated by Electron Cyclotron Resonance Plasma Etching: S. A. Grot, G. S. Gildenblat, and A. R. Badzian, IEEE ELECTRON DEVICE LETT. VOL 13 No. 9, September 1992, pp 462-463". This approach, however, requires complicated processes including etching. Heretofore, therefore, no acceptable technique has been established for insulating respective elements made on a common diamond substrate from each other.

The present inventors formerly proposed at Applied Physics Conference a method for fabricating MESFET including a source ohmic contact and a drain ohmic contact made by vapor deposition of gold onto hydrogen-terminated diamond as a p-type semiconductor, and a gate electrode made by vapor deposition of aluminum (Aoki, Ito, Kawarada, et al.: Brief of 40th Joint Meeting Related to Applied Physics, p.30, MK11, 12). This method certainly provides MESFETs having a simple structure and operative in an enhanced mode; however, since a surface conductive layer is formed directly under the hydrogen-terminated surface of the homoepitaxial diamond, even this method failed to insulate respective elements, and could not integrate a plurality of semiconductor elements on a common substrate.

OBJECT OF THE INVENTION

It is therefore an object of the invention to readily isolate a plurality of semiconductor elements on a surface of a common hydrogen-terminated homoepitaxial diamond substrate from each other.

Another object of the invention is to provide a simple method for fabricating an element-isolated hydrogen-terminated diamond semiconductor device with a plurality of semiconductor elements insulated from each other on a common hydrogen-terminated diamond surface, using a reduced number of masks.

SUMMARY OF THE INVENTION

According to a first aspect of the invention, there is provided an element-isolated hydrogen-terminated diamond semiconductor device including semiconductor elements in hydrogen-terminated surface regions of diamond and a non-hydrogen-terminated region surrounding each semiconductor element to insulate the semiconductor elements from each other.

According to a second aspect of the invention, there is provided a method for fabricating an element-isolated hydrogen-terminated diamond semiconductor device, comprising the steps of oxygen-terminating a surface of diamond to make it into an insulator; changing selective regions of the oxygen-terminated insulating surface of the diamond into semiconductors by locally hydrogen-terminating the regions; and making a hydrogen-terminated diamond semiconductor element on each hydrogen-terminated semiconductor region.

According to a third aspect of the invention, there is provided a method for fabricating an element-isolated hydrogen-terminated diamond semiconductor device, comprising the steps of hydrogen-terminating a surface of diamond to change it into a semiconductor; oxygen-terminating selective portions of the diamond surface by oxygen processing onto the hydrogen-terminated semiconductor surface to locally change it into an insulating region; and making a hydrogen-terminated diamond semiconductor element on each selective hydrogen-terminated semiconductor region.

According to a fourth aspect of the invention, there is provided a method for fabricating an element-isolated hydrogen-terminated diamond semiconductor element, comprising the steps of hydrogen-terminating a surface of diamond to change into a semiconductor; depositing a metal film on selective regions of the hydrogen-terminated semiconductor surface to form electrodes of semiconductor elements to be made there; processing the hydrogen-terminated diamond surface other than said selective regions to locally change it into an insulating region.

Although diamond is an insulator at room temperature, p-type semiconductor regions can be made by hydrogen-terminating a diamond surface. Methods for hydrogen-terminating the surface of diamond include, for example, a method of processing a diamond surface with hydrogen plasma ($H_2$ plasma), and a method of introducing hydrogen gas as the atmosphere in a reaction vessel after composing diamond by CVD, etc. On the other hand, when the surface of diamond is non-hydrogen-terminated (oxygen-terminated) by applying oxygen plasma ($O_2$ plasma) onto the diamond surface, exposing a diamond surface to air (oxygen) after being composed, or by irradiating argon ions onto the diamond surface, an insulating region can be made on the diamond surface. By localizing two different regions, i.e. semiconductor regions and insulating regions, in these manners, a plurality of hydrogen-terminated insulated diamond semiconductor elements can be made on a common diamond substrate.

BRIEF DESCRIPTION OF THE DRAWINGS

FIG. 3 is a schematic diagram of a terminal structure of diamond;

DETAILED DESCRIPTION OF THE PREFERRED EMBODIMENTS

Figure 1:
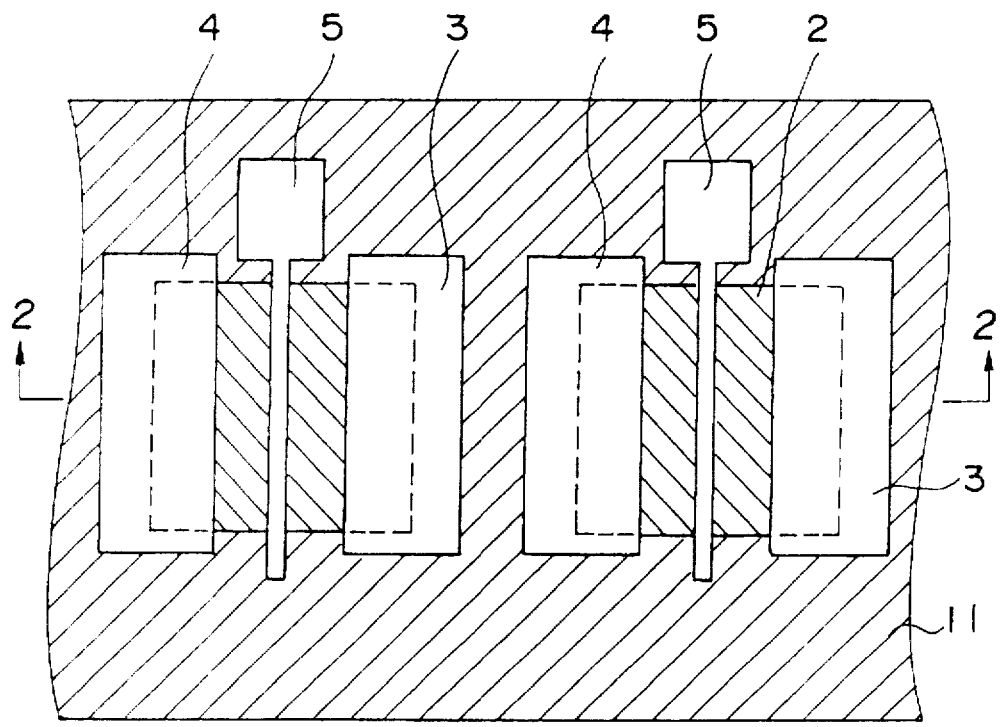
FIG. 1 is a fragmentary plan view of a hydrogen-terminated diamond semiconductor according to the invention.
Figure 2:
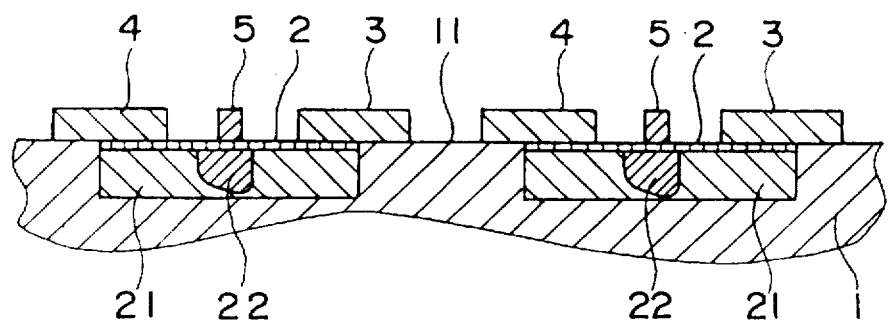
FIG. 2 is a cross-sectional view of the same hydrogen-terminated diamond semiconductor, taken along the A—A line of FIG. 1.

FIG. 1 schematically shows a semiconductor device including a plurality of MESFETs on a surface of a homo-epitaxial diamond film, taken as an embodiment of the invention, and FIG. 2 is a cross-sectional view taken along the A—A line of FIG. 1.

As shown in FIG. 1, the semiconductor device comprises a hydrogen-terminated homoepitaxial diamond film 1 prepared by epitaxially growing monocrystalline diamond on a diamond plate by a microwave plasma process, then making hydrogen-terminated regions 2 and a non-hydrogen-terminated region 11 on a surface of the hydrogen-terminated homoepitaxial diamond film 1, and making on each hydrogen-terminated region 2 a drain electrode contact 3 and a source electrode contact 4 by vapor deposition of gold which makes an ohmic contact, and a gate electrode 5 by vapor deposition of aluminum which forms a good Schottky barrier contact.

Formed under each hydrogen-terminated region 2 is a p-type semiconductor layer 21 as shown in FIG. 2. By providing aluminum in contact with the region, a Schottky barrier is produced along the contact, and a depletion layer 22 is produced in the semiconductor layer 21 located under the aluminum. Thus a gate is formed, which blocks the flow of an electric current during no gate voltage being applied, and permits an electric current to flow when the depletion disappears due to a forward voltage applied between the gate and the source. Since the surface conductive layer comprising the p-type semiconductor layer 21 is as thin as 100 Å to hundreds of Å, the MESFET can operate in an enhanced mode. Therefore, a FET having the gate between the drain and the source is formed. On the other hand, insulation is established along the lower surface of the non-hydrogen-terminated region 11, and the insulating region isolate each semiconductor element from others.

The term "hydrogen-termination" used in the present invention pertains to a status of a diamond crystal terminated by coupling hydrogen atoms with dangling bonds, i.e. unoccupied bonds, of carbon atoms in the surface layer of the diamond crystal grown. For example, by depositing a diamond film in the presence of hydrogen atoms, a hydrogen-terminated homoepitaxial diamond film can be obtained. The term "non-hydrogen-termination" pertains to a status of the diamond crystal with its surface terminated by atoms other than hydrogen atoms. For example, by processing the surface of hydrogen-terminated diamond with oxygen plasma, oxygen-terminated regions can be obtained. FIG. 3 shows terminal structures of a hydrogen-terminated region and oxygen-terminated regions. The surface layer of a carbon crystal in each hydrogen-terminated region is terminated by hydrogen atoms, and those in the oxygen-terminated regions are terminated by oxygen atoms.

Shown below are specific conditions employed to fabricate hydrogen-terminated homoepitaxial diamond used in the invention. Namely, diamond single crystal was epitaxially grown by heating a diamond substrate to 850° C., introducing a mixed gas with 10% of carbon oxide gas (CO) in hydrogen gas ($H_2$) as the material gas, and applying the pressure of 35 Torr. Also usable as the material gas in lieu of this example are various kinds of hydrocarbon such as methane, ethane, butane, and ethylene.

With reference to FIGS. 4A to 4D and FIGS. 5A to 5D, different methods for making hydrogen-terminated regions and non-hydrogen-terminated regions on a surface of diamond are illustrated. FIGS. 4A to 4D show a method using oxygen-terminated diamond for making two different kinds of regions, oxygen-terminated region and hydrogen-terminated region. FIGS. 5A to 5D show a method using hydrogen-terminated diamond for making two different regions, hydrogen-terminated region and oxygen-terminated region.

Figure 4A:
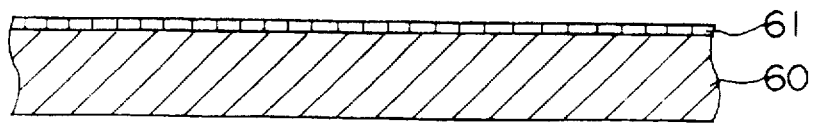
FIG. 4A through FIG. 4D show a process for insulating semiconductor regions in the hydrogen-terminated diamond semiconductor device according to the invention.
Figure 4B:
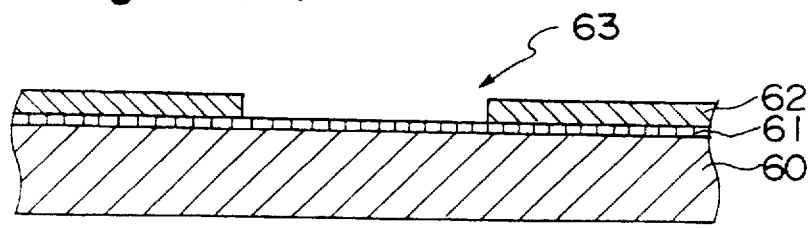
Figure 4C:
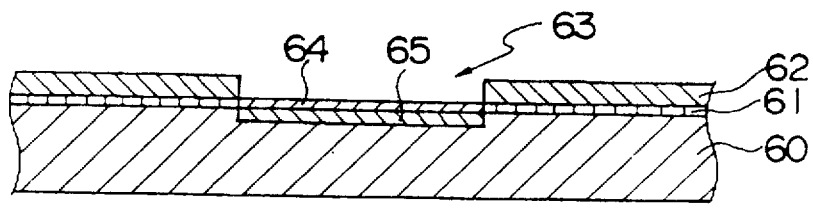
Figure 4D:
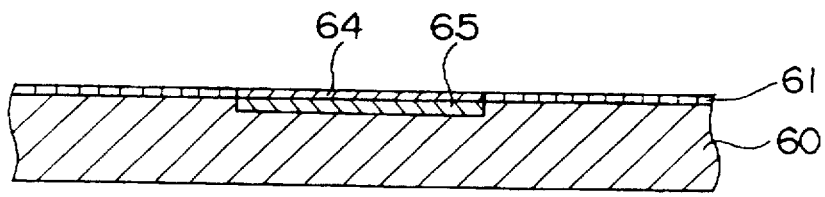

In FIGS. 4A to 4D, a diamond substrate is put in a MPCVD apparatus using microwaves as an excitation source. Introduced into the MPCVD apparatus is a mixed gas containing hydrogen ($H_2$) and a carbon-supplying gas such as methane ($CH_4$), ethane ($C_2H_6$), butane ($C_4H_{10}$), ethylene ($C_2H_4$), carbon oxide (CO) or carbon dioxide ($CO_2$). The mixed gas is excited into plasma by microwaves, and diamond crystal is epitaxially grown on the surface of the diamond substrate to form a homoepitaxial diamond film 60. After that, the sample is rapidly cooled in the air, such that oxygen atoms bond to dangling bonds of carbon atoms in the surface layer of the diamond crystal to make the diamond crystal have an oxygen-terminated surface (61). Thus obtained is an oxygen-terminated homoepitaxial diamond surface (FIG. 4A). Next formed is a mask 62 having an opening 63 by locally depositing a silicon dioxide ($SiO_2$)

film on the surface of the oxygen-terminated homoepitaxial diamond by RF sputtering (FIG. 4B). The oxygen-terminated epitaxial diamond having the mask 62 is subjected to hydrogen processing for two minutes in the MPCVD apparatus under conditions of hydrogen gas ($H_2$) of 200 sccm, 35 Torr and 840° C. As a result, oxygen atoms in the surface layer in the opening 63 are replaced by hydrogen atoms, and selective regions with a hydrogen terminated surface 64 are obtained. Made under the hydrogen-terminated surface 64 is a p-type semiconductor region 65 (FIG. 4C). The mask 62 is subsequently removed by HF processing onto the surface, a surface having both semiconductor regions and insulating regions is obtained (FIG. 4D). After that, a gate electrode, drain ohmic contact and source ohmic contact are made on each p-type semiconductor region 65 by using known methods. In this manner, a plurality of semiconductor elements insulated from each other can be made on a single substrate.

Figure 5A:
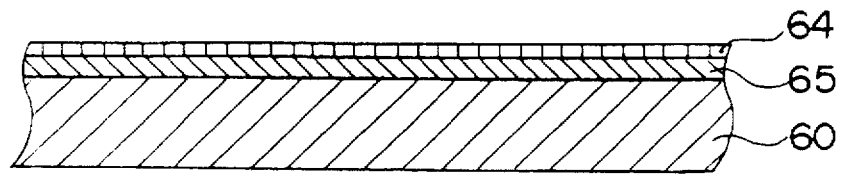
FIG. 5A through FIG. 5D show another example of the process for insulating semiconductor regions in the hydrogen-terminated diamond semiconductor device according to the invention.
Figure 5B:
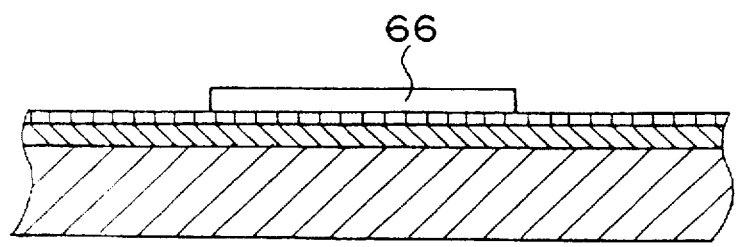
Figure 5C:
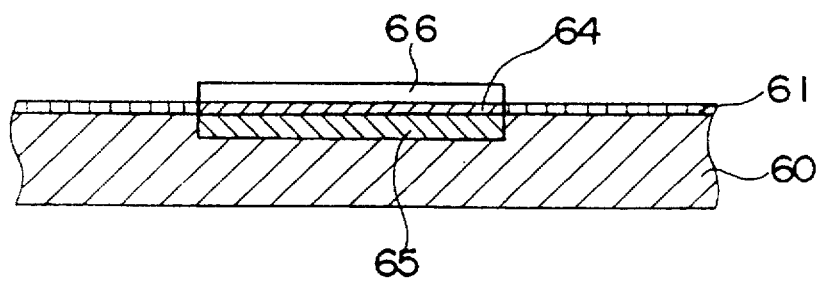
Figure 5D:
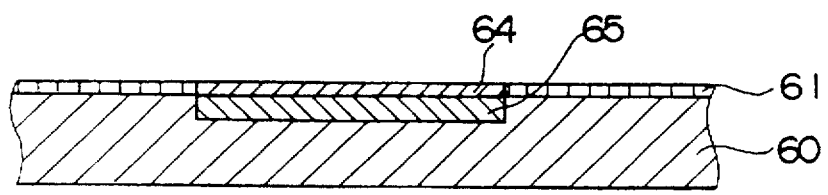

In another method, shown in FIGS. 5A to 5D, taken as a second embodiment for making two different regions by using a hydrogen-terminated surface, a diamond substrate is put in a plasma CVD apparatus using microwaves as its exciting source. Introduced into the plasma CVD apparatus is a mixed gas containing hydrogen ($H_2$) and a carbon-supplying gas such as methane ($CH_4$), ethane ($C_2H_6$), butane ($C_4H_{10}$), ethylene ($C_2H_4$), carbon oxide (CO) and carbon dioxide ($CO_2$). The mixed gas is excited into plasma by microwaves, and diamond crystal is epitaxially grown on the surface of the diamond substrate to form a homoepitaxial diamond film 60. After that, the substrate is rapidly cooled in the presence of hydrogen gas, such that hydrogen atoms bond to dangling bonds of carbon atoms in the surface layer of the diamond crystal to form the hydrogen-terminated surface 64. Thus obtained is a hydrogen-terminated homoepitaxial diamond substrate having a surface conductive layer 65 (FIG. 5A). A silicon dioxide ($SiO_2$) film is next deposited on the surface of the hydrogen-terminated homoepitaxial diamond by sputtering, and a mask 66 is formed by a known method for covering selective portions to be maintained as p-type semiconductor regions (FIG. 5B). After that, the hydrogen-terminated epitaxial diamond having the mask 66 is subjected to oxygen plasma processing in the MPCVD apparatus, and hydrogen atoms of the hydrogen-terminated surface in the regions not covered by the mask 66 are replaced by oxygen atoms. As a result, a oxygen-terminated surface 61 is obtained. The portion under the oxygen-terminated surface 61 has a non-conductivity (FIG. 5C). The mask 66 is subsequently removed by HF processing onto the surface, a substrate having both semiconductor regions and insulating regions is obtained (FIG. 5D). After that, a gate electrode, drain ohmic contact and source ohmic contact are made on each p-type semiconductor region 65 by known methods. In this manner, a plurality of semiconductor elements insulated from each other can be made on a single substrate.

Figure 6:
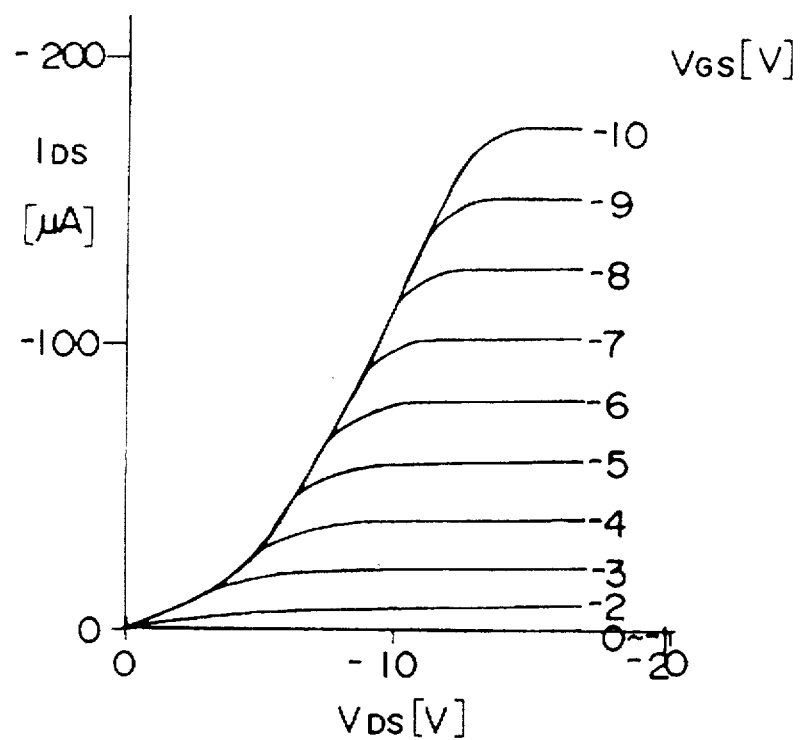
FIG. 6 is a diagram illustrating characteristics of a hydrogen-terminated diamond semiconductor device according to the invention.
Figure 7:
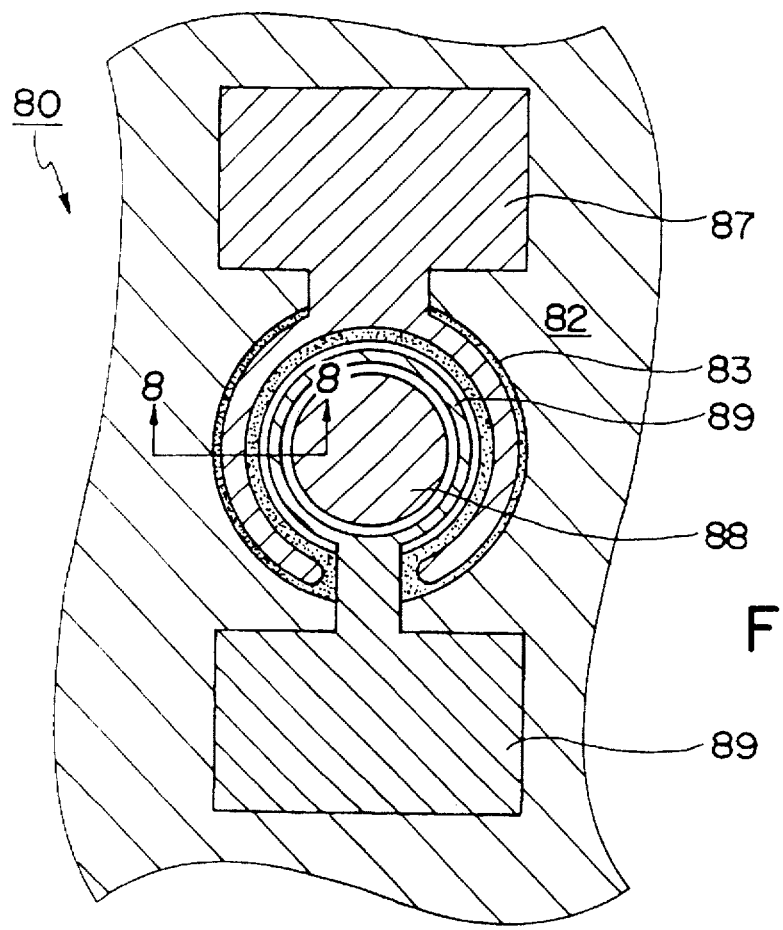
FIG. 7 is a fragmentary plan view of a conventional diamond semiconductor device.
Figure 8:
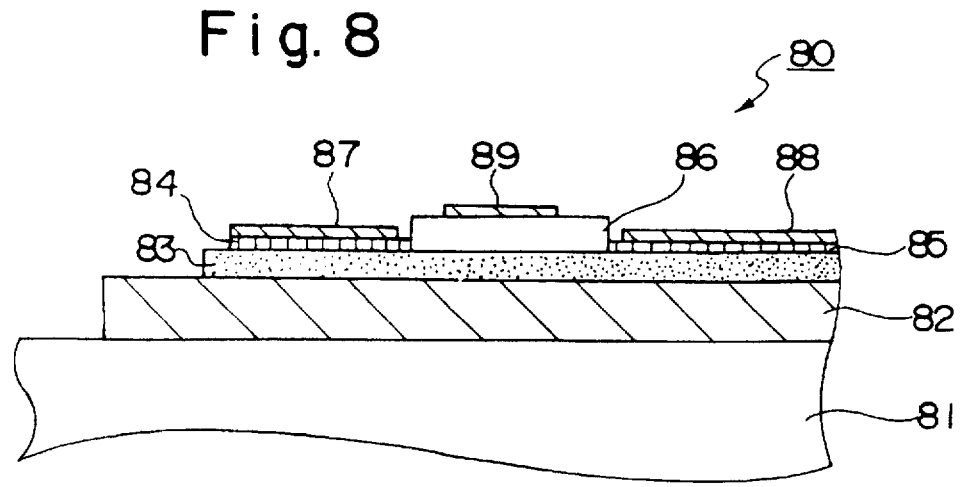
FIG. 8 is a cross-sectional view of the same diamond semiconductor device, taken along the B—B line of FIG. 7.

FIG. 6 shows Vds-Ids characteristic curves, putting drain-source voltages Vds (V) on the abscissa and drain-source currents Ids (μA) on the ordinate, and taking gate-source voltages Vgs (V) as parameters. It is known from FIG. 6 that, in the range of low gate-source voltages Vgs (zero to −1V), substantially no drain-source current Ids flows and the device operates in its enhanced mode. That is, the device has a vivid saturation characteristic. By varying the gate-source voltage Vgs, the drain-source current Ids can be changed as desired.

According to the invention, by hydrogen-terminating a surface layer of a diamond film, a very thin p-type semiconductor layer can be formed under the hydrogen-terminated surface, and a Schottky barrier can be made by depositing aluminum on a gate region and using it as a gate. Therefore, the gate can readily be made with a very simple structure, and a MESFET operative in an enhanced mode can be fabricated in a very simple process. Moreover, by non-hydrogen-terminating selective portions of the surface layer of the diamond extending between respective semiconductor elements, no p-type semiconductor layer is formed there, and respective elements can be insulated reliably.

The foregoing embodiments have been described as using gold as the material of ohmic electrodes and aluminum as the material of Schottky barrier electrodes; however, it is only required for the material of ohmic electrode to exhibit a high electronegative tendency, and platinum (Pt) can be used in lieu of gold. Usable as the material for making Schottky barriers are lead (Pb), tantalum (Ta), zinc (Zn), indium (In), etc. in lieu of aluminum.

The foregoing embodiments have been explained as using hydrogen-terminated homoepitaxial diamond obtained by microwave plasma CVD; however, other appropriate methods such as hot filament method, radio-frequency hot plasma CVD, d.c. arc plasma CVD, combustion flame method, etc. are also usable. Moreover, the diamond need not be prepared by homoepitaxial growth; instead, the invention can apparently be applied to any of heteroepitaxial diamond grown by vapor deposition, natural diamond monocrystal, hydrogen-terminated diamond and a diamond monocrystal made by a high-pressure method, prepared by processing in the atmosphere of hydrogen plasma, considering the fundamental of the invention that the p-type semiconductor layer can be made by hydrogen-terminating the surface layer of the diamond.

Figure 9:
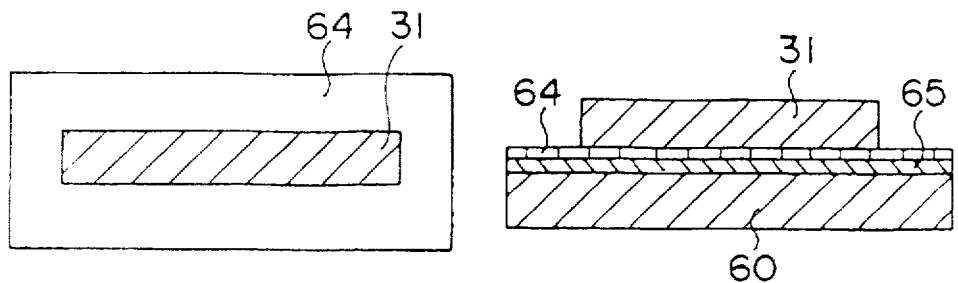
FIG. 9A through FIG. 9D show a third example of the process for insulating semiconductor regions in the hydrogen-terminated diamond semiconductor device according to the invention.
Figure 9:
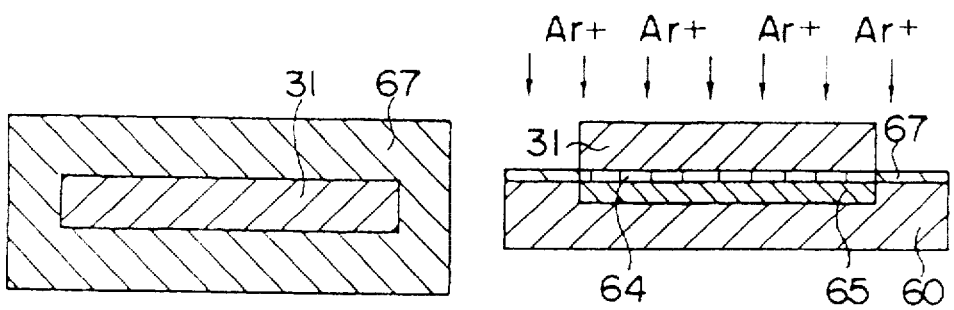

FIG. 9 shows a third embodiment of the invention. The third embodiment features the use of irradiation of argon ions (ArHd$^+$) for insulating semiconductor elements made by using hydrogen-terminated diamond. This embodiment is additionally characterized in the use of a metal film of gold, etc., so as to use the metal film not only as source ohmic contacts and drain ohmic contacts of semiconductor elements to be made, but also as the mask for protecting selective sites of the hydrogen-terminated diamond surface for the semiconductor elements to be made upon irradiation of argon ions.

The third embodiment is explained below with reference to FIG. 9. A diamond substrate is put in a plasma CVD apparatus using microwaves as its exciting source. Introduced into the plasma CVD apparatus is a mixed gas containing hydrogen ($H_2$) and a carbon-supplying gas such as methane ($CH_4$), ethane ($C_2H_6$), butane ($C_4H_{10}$), ethylene ($C_2H_4$), carbon oxide (CO) or carbon dioxide ($CO_2$). The mixed gas is excited into plasma by microwaves, and diamond crystal is epitaxially grown on the surface of the diamond substrate to form a homoepitaxial diamond film 60. After that, the substrate is rapidly cooled in the presence of hydrogen gas, such that hydrogen atoms bond to dangling bonds of carbon atoms in the surface layer of the diamond crystal to form the hydrogen-terminated surface 64 of the diamond crystal to provide a hydrogen-terminated homoepitaxial diamond substrate having a surface conductive layer 65. After a positive resist is next applied onto the hydrogen-terminated homoepitaxial diamond substrate, a pattern is drawn on the resist by an electron beam drawing device to define regions for making hydrogen-terminated diamond semiconductors. The substrate is subsequently immersed in a developer to dissolve selective portions of the resist irradiated by the electron beam, and gold (Au) is deposited there by vacuum evaporation using resistance heating to make a gold thin film 31 forming source contacts and drain contacts (FIG. 9A).

The gold thin film 31 is next used as a mask to selectively irradiate argon ions ($Ar^+$). Hydrogen-terminated regions damaged by irradiation of argon ions, 67, become non-conductive, and selective portions of the surface conductive layer 65 under the hydrogen-terminated surface 64 disappear. That is, electric conductivity is maintained only in the regions masked by the gold thin film 31, and the other regions are changed non-conductive. As a result, semiconductor regions isolated from each other are made on the surface (FIG. 9B).

Figure 9C:
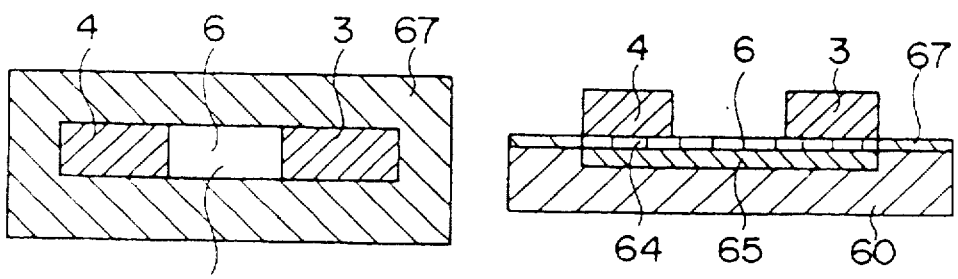
Figure 9D:
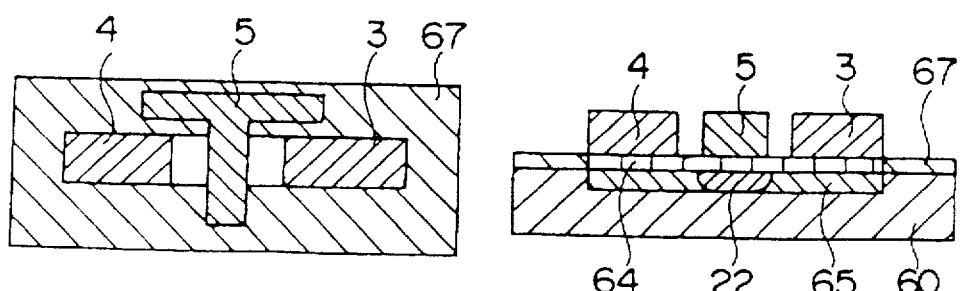

After that, the central portion of the mask comprising the gold thin film 31 in each semiconductor portion is removed to make a source electrode portion 3, drain electrode portion 4 and channel portion 6 (FIG. 9C). Two methods are usable to selectively remove the gold thin film 31, one of which removes the central portion of the film 31 mechanically and the other of which uses a mask covering selective portions of the film 31 to be maintained as source and drain electrodes and removes the unmasked central portion of the film 31 by using aqua regia.

After a positive resist is next applied onto the homoepitaxial diamond film having source electrodes 3 and drain electrodes 4 already made, a pattern is drawn on the resist by an electron beam drawing device to define portions for gate electrodes. The surface is subsequently immersed in a developer to dissolve selective portions of the resist irradiated by the electron beam, and lead (Pb) is deposited there by vacuum evaporation using a resistance heating, for example, to form a gate portion 5. In this manner, a plurality of element-isolated MESFETs are made on the common diamond film.

It is already known that the sheet resistance of diamond varies with the dosing amount of argon ions, as taught by J. F. Prins in Materials Science Reports 7 (1992) 271–364. The embodiment employs the dosing amount of $1.7 \times 10^{14}$ ions/ $cm^2$ and the accelerating voltage of 30 keV such that the sheet resistance of the ion-damaged layer of the diamond is increased by the dosing of argon ions, that is, not to change the surface of the diamond into graphite.

Figure 10:
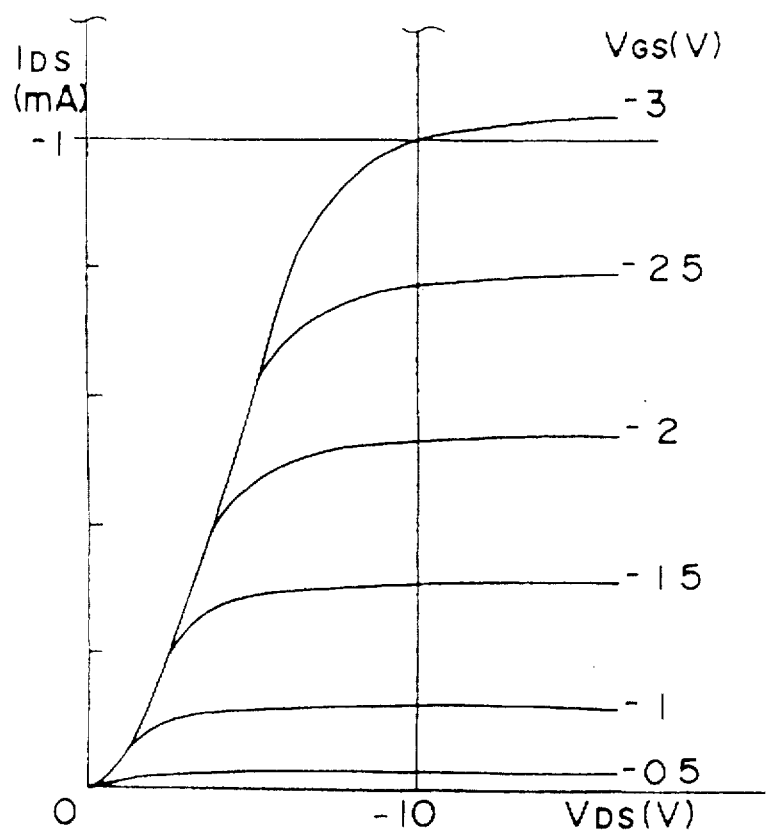
FIG. 10 is a diagram showing characteristics of the hydrogen-terminated diamond semiconductor device obtained by the process of FIGS. 9A to 9D.
Figure 11A:
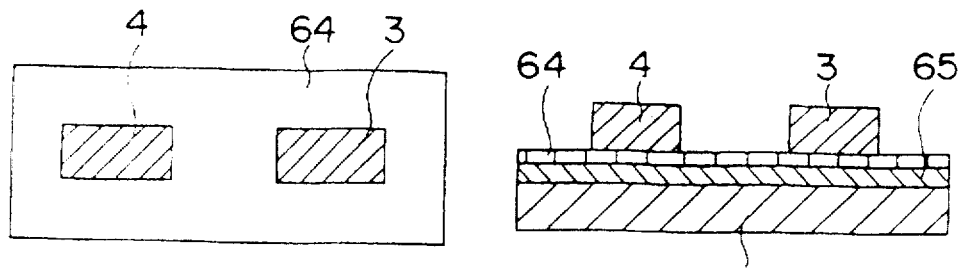
FIG. 11A through FIG. 11D show a fourth example of the process for isolating semiconductor regions in the hydrogen-terminated diamond semiconductor device according to the invention.
Figure 11B:
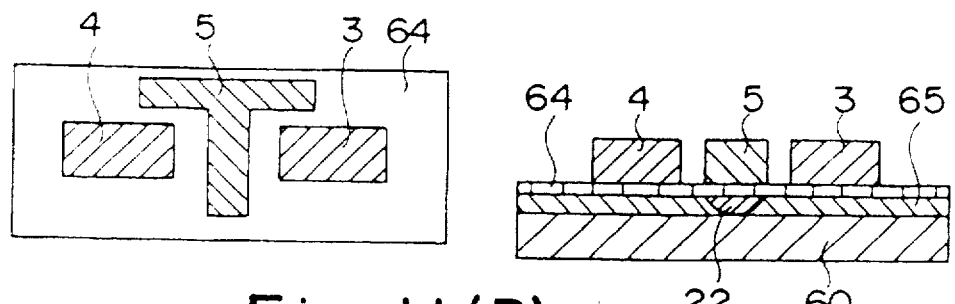
Figure 11C:
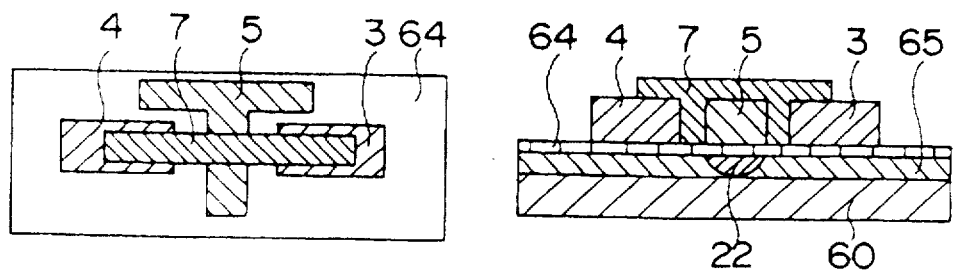
Figure 11D:
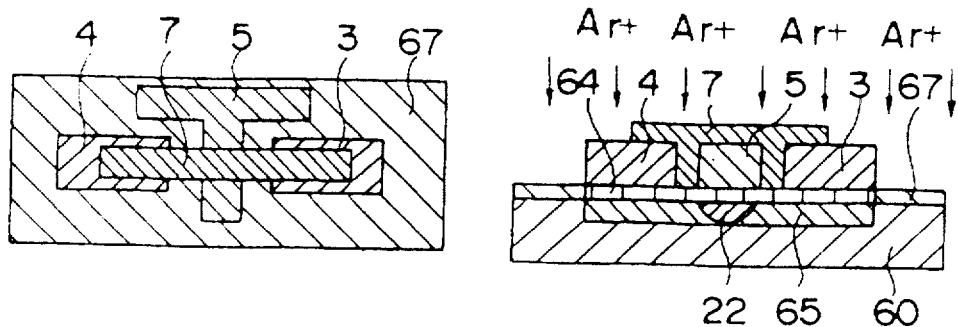

FIG. 10 shows characteristics of a MESFET obtained by the embodiment, putting drain-source voltages Vds (V) on the abscissa and drain-source currents Ids (mA) on the ordinate, and taking gate-source voltages Vgs (V) as parameters. In this MESFET, the gate length is 7 µm, and the gate width is 120 µm. It is known from the Vds-Ids characteristic curves of FIG. 10 that, in the range of low gate-source voltages Vgs (zero to −0.5V), substantially no drain-source current Ids flows and the device operates in an enhanced mode. That is, the device exhibits a vivid saturation characteristic. By varying the gate-source voltage Vgs, the drain-source current Ids can be changed as desired. At the point where the drain-source voltage Vds is −16V, since the drain-source current Ids varies by 0.24 mA with the change in the gate-source current Ids by 0.5V and the gate width is 0.12 mm, the mutual conductance becomes as high as 4 mS/mm.

According to the invention, since a gold film forming source electrodes and drain electrodes is also used as a mask upon making insulating portions comprising a non-hydrogen-terminated surface surrounding respective hydrogen-terminated diamond semiconductor elements, the invention can omit the process for aligning masks which are otherwise used to make insulating regions, which apparently contributes to remarkable simplification of the manufacturing process.

Next explained is a fourth embodiment with reference to FIG. 11. This embodiment is characterized in forming hydrogen-terminated diamond semiconductor elements by making source electrodes, drain electrodes and gate electrodes on a hydrogen-terminated diamond surface; then using these electrodes as a mask for making insulating regions and applying a resist mask covering channel portions; and irradiating argon ions by using the latter mask to form insulating regions around respective elements to isolate these elements from each other.

A homoepitaxial diamond film is prepared in the same manner as used in the third embodiment shown in FIG. 9. The homoepitaxial diamond film is rapidly cooled in the presence of hydrogen gas, such that hydrogen atoms bond to dangling bonds of carbon atoms in the surface layer of the diamond crystal to form a hydrogen-terminated surface 64 on the diamond crystal. Thus made is a hydrogen-terminated homoepitaxial diamond film having a surface conductive layer 65. After a positive resist is next applied onto the hydrogen-terminated homoepitaxial diamond film, a pattern is drawn on the resist by an electron beam drawing device to define regions for making source electrodes and drain electrodes of hydrogen-terminated diamond semiconductors. The film is subsequently immersed in a developer to dissolve selective portions of the resist irradiated by the electron beam, and gold (Au) is deposited there by vacuum evaporation using resistance heating to form source electrodes 4 and drain electrodes 3 (FIG. 10A).

Substantially the same process is repeated to form a gate electrode 5 of lead (Pb) between each source electrode 4 and drain electrode 3 (FIG. 10B). Further applied on channel portions is a mask 7 by a known method using a resist not to change the channel portions 6 non-conductive by irradiation of argon ions (FIG. 10C). Here again, an electron beam drawing device is used.

The entirety of the surface is next irradiated by argon ions ($Ar^{30}$). As a result, the hydrogen-terminated surface layer in the regions of the surface other than the hydrogen-terminated diamond semiconductor elements is changed non-conductive to form an argon-ion-damaged layer 67, and selective regions under the source electrodes 4, drain electrodes 3 and resist 7 remain hydrogen-terminated and electrically conductive, such that respective semiconductor elements are isolated from each other (FIG. 10D). By next removing the mask 7, a plurality of element-isolated MESFETs are made on the common diamond substrate. This embodiment employs the dosing amount of $1.0 \times 10^{14}$ ions/$cm^2$ and the accelerating voltage of 25 keV.

A NAND circuit comprising MESFETs was actually made by the method according to the invention, and exhibited vivid operation characteristics with a gain around 3. A NOR circuit was also made by the same method, and exhibited vivid operation characteristics with a gain around 5.

As described above, the invention provides MESFETs operative in an enhanced mode and having a large mutual conductance by making gate electrodes on a surface of hydrogen-terminated homoepitaxial diamond by vapor deposition using aluminum, lead of other metal which forms a Schottky barrier, and then making source electrodes and drain electrodes by vapor deposition of a highly electronegative metal such as gold or platinum. Additionally, by non-hydrogen-terminating selective portions of the surface layer of the diamond surrounding the respective elements, insulation of respective elements from each other can be accomplished by simple fabricating process and means, and a diamond semiconductor device integrating a plurality of semiconductor elements can be obtained.

The invention not only simplifies the process for making a plurality of diamond semiconductor elements on a single substrate but also enables the use of any simple configuration of FET, for example, other than a circular shape is employable, which contributes to a further miniaturization and a higher integration.

Moreover, since the invention need not introduce an impurity for making the semiconductor layer, the device can be made with safety without using $B_2H_6$ or other toxic gas, and can simplify equipment for fabrication without the need for accounts on such a toxic gas.

The invention can use vapor deposition for making gate electrodes, source-ohmic contacts and drain-ohmic contacts, and hence simplifies the manufacturing process.

Further, since FETs according to the invention can be made of diamond having a large band gap, they can be used even under a high temperature environment and reliably operate under intensive X rays as well.

In addition to these, since the invention uses a metal film for electrodes of FETs as a mask for changing selective surface portions of the diamond from a hydrogen-terminated surface to a non-hydrogen-terminated surface, it can reduce the number of masks to be made and can remove the need for alignment of such masks for the non-hydrogen-terminating process, which remarkably simplifies the process and increases the mutual conductance to a value as high as 4mS/mm.

Although the invention has been shown and described with respect to preferred embodiments thereof, it should be understood by those skilled in the art that the foregoing and other changes and omissions in the form and detail thereof may be made therein without departing from the spirit and scope of the invention.

What is claimed is:

1. An element-isolated hydrogen-terminated diamond semiconductor device, comprising:

at least one hydrogen-terminated region formed by terminating a first region of a surface layer of diamond with hydrogen;

a non-hydrogen-terminated insulating region formed by terminating a second region of said surface layer of the diamond with a chemical element other than hydrogen; and a semiconductor element formed on each said hydrogen-terminated region.

2. The element-isolated hydrogen-terminated diamond semiconductor device according to claim 1, wherein said nonhydrogen-terminated region is an oxygen-terminated region made by hydrogen-terminating said second region of said surface layer of the diamond and then replacing hydrogen in said second region of said surface layer with oxygen using oxygen plasma processing.

3. The element-insolated hydrogen-terminated diamond semiconductor device according to claim 1, wherein said non-hydrogen-terminated region is made by hydrogen-terminating said second region of said surface layer of the diamond and then replacing hydrogen in said second region of said surface layer by an element other than hydrogen by irradiating argon ions.

4. The element-isolated hydrogen-terminated diamond semiconductor device according to claims 1 to 3, wherein said semiconductor element is a metal semiconductor field effect transistor (MESFET).

5. The element-isolated hydrogen-terminated diamond semiconductor device according to claim 1, wherein said MESFET has a drain electrode and a source electrode both made of gold or platinum, and has a gate electrode made of metal forming a Schottky barrier whit diamond.

* * * * *